United States Patent
Lai et al.

(10) Patent No.: US 9,425,354 B2
(45) Date of Patent: Aug. 23, 2016

(54) EPITAXY BASE, SEMICONDUCTOR LIGHT EMITTING DEVICE AND MANUFACTURING METHODS THEREOF

(71) Applicant: PlayNitride Inc., Tainan (TW)

(72) Inventors: Yen-Lin Lai, Tainan (TW); Jyun-De Wu, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 14/810,487

(22) Filed: Jul. 28, 2015

(65) Prior Publication Data
US 2016/0099381 A1    Apr. 7, 2016

(30) Foreign Application Priority Data
Oct. 2, 2014   (TW) .............................. 103134381 A

(51) Int. Cl.
| | |
|---|---|
| *H01L 21/00* | (2006.01) |
| *H01L 21/20* | (2006.01) |
| *H01L 27/15* | (2006.01) |
| *H01L 31/109* | (2006.01) |
| *H01L 33/12* | (2010.01) |
| *H01L 33/58* | (2010.01) |

(Continued)

(52) U.S. Cl.
CPC .............. *H01L 33/12* (2013.01); *C23C 14/34* (2013.01); *H01L 33/0075* (2013.01); *H01L 33/32* (2013.01); *H01L 33/58* (2013.01)

(58) Field of Classification Search
CPC ..... C30B 29/403; C30B 23/00; C30B 25/02; C30B 25/00; C30B 29/38; C30B 25/16; C30B 29/40; H01L 21/02389; H01L 29/2003; H01L 33/0075; H01L 33/30

USPC ....... 257/21, 76, 79, 83, 103, 184, 189, 200, 257/201; 438/22, 41, 46, 48, 503, 507, 602, 438/604

See application file for complete search history.

(56) References Cited

U.S. PATENT DOCUMENTS 7,297,978 B2 * 11/2007 Yamazaki ........... H01L 27/1277
257/59
7,528,462 B2 *  5/2009 Fukuyama ............ C30B 25/183
117/101

(Continued)

FOREIGN PATENT DOCUMENTS

| | | |
|---|---|---|
| TW | 201401554 | 1/2014 |
| TW | 201415663 | 4/2014 |

OTHER PUBLICATIONS

Meei-Ru Chen, et al., "Characterization of Low Temperature Grown AlN Films on Sapphires Using Helicon Sputtering Method," Journal of Ching-Yun University, vol. 32, No. 3, Jul. 2012, pp. 1-10.

(Continued)

*Primary Examiner* — Hsien Ming Lee
(74) *Attorney, Agent, or Firm* — Jianq Chyun IP Office

(57) ABSTRACT

An epitaxy base including a substrate and a nucleating layer disposed on the substrate. The nucleating layer is an AlN layer with a single crystal structure. A diffraction pattern of the nucleating layer includes a plurality of dot patterns. Each of the dot patterns is substantially circular, and a ratio between lengths of any two diameters perpendicular to each other on each of the dot patterns ranges from approximately 0.9 to approximately 1.1. A semiconductor light emitting device, a manufacturing method of the epitaxy base, and a manufacturing method of the light emitting semiconductor device are further provided.

4 Claims, 5 Drawing Sheets

(51) Int. Cl.
*H01L 33/00* (2010.01)
*H01L 33/32* (2010.01)
*C23C 14/34* (2006.01)

(56) References Cited

U.S. PATENT DOCUMENTS

2004/0224459 A1* 11/2004 Nishikawa ............. C30B 23/02
438/202

2010/0276710 A1* 11/2010 Sampath ................ B82Y 20/00
257/94

OTHER PUBLICATIONS

"Office Action of Taiwan Counterpart Application," issued on Sep. 4, 2015, p. 1-p. 7.

* cited by examiner

EPITAXY BASE, SEMICONDUCTOR LIGHT EMITTING DEVICE AND MANUFACTURING METHODS THEREOF

CROSS-REFERENCE TO RELATED APPLICATION

This application claims the priority benefit of Taiwan application serial no. 103134381, filed on Oct. 2, 2014. The entirety of the above-mentioned patent application is hereby incorporated by reference herein and made a part of this specification.

BACKGROUND OF THE INVENTION

1. Field of the Invention

The invention relates to an epitaxy base, a semiconductor light emitting device, and manufacturing methods thereof, and particularly relates to an epitaxy base, a semiconductor light emitting device, and manufacturing methods thereof offering a preferable epitaxy quality.

2. Description of Related Art

Semiconductor light emitting devices, such as light-emitting diodes (LEDs), are manufactured by using compounds (e.g. gallium nitride, gallium phosphide, and gallium arsenide.) containing a Group III-V element. A lifetime of the LEDs may be as long as 100,000 hours. In addition, the LEDs have the advantages of a quick responding speed (approximately $10^{-9}$ seconds), smaller size, lower power consumption, low pollution, high reliability, as well as the capability for mass production. Thus, LEDs are constantly used in a variety of fields, such as luminaire, traffic signal lamps, mobile phones, scanners, and fax machines.

During the manufacturing process of the semiconductor light emitting devices, due to the differences in lattice constant and thermal expansion coefficient (CTE) between semiconductor layers and a hetero-substrate, dislocations and a thermal stress caused by CTE mismatch in the epitaxy process are commonly found on the semiconductor layers. Therefore, the conventional semiconductor light emitting device may be severely bent due to the stress and the chance of generating cracks is thus increased.

SUMMARY OF THE INVENTION

The invention provides an epitaxy base and a semiconductor light emitting device having a preferable epitaxy quality.

The invention also provides manufacturing methods of an epitaxy base and a semiconductor light emitting device for manufacturing the epitaxy base and the semiconductor light emitting device.

An epitaxy base according to the invention includes a substrate and a nucleating layer. The nucleating layer is disposed on the substrate, wherein the nucleating layer is an aluminum nitride layer having a single crystal structure, a diffraction pattern of the nucleating layer includes a plurality of dot patterns, each of the dot patterns is substantially circular, and a ratio between lengths of any two diameters perpendicular to each other on each of the dot patterns ranges from approximately 0.9 to approximately 1.1.

According to an embodiment of the invention, a surface of the substrate close to the nucleating layer is a plane.

According to an embodiment of the invention, the nucleating layer is formed on the substrate by sputtering.

A semiconductor light emitting device according to the invention includes an epitaxy base, a first type semiconductor layer, an active layer, and a second type semiconductor layer. The epitaxy base includes a substrate and a nucleating layer. The nucleating layer is disposed on the substrate, wherein the nucleating layer is an aluminum nitride layer having a single crystal structure, a diffraction pattern of the nucleating layer includes a plurality of dot patterns, each of the dot patterns is substantially circular, and a ratio between lengths of any two diameters perpendicular to each other on each of the dot patterns ranges from approximately 0.9 to approximately 1.1. The first type semiconductor layer is disposed on the nucleating layer. The active layer is disposed on the first type semiconductor layer. The second type semiconductor layer is disposed on the active layer.

According to an embodiment of the invention, the semiconductor light emitting device further includes a buffer layer disposed between the nucleating layer and the first type semiconductor layer.

According to an embodiment of the invention, a surface of the substrate close to the nucleating layer is a plane.

According to an embodiment of the invention, the nucleating layer is formed on the substrate by sputtering.

A manufacturing method of an epitaxy base according to the invention includes: providing a substrate; and forming a nucleating layer in a form of a single crystal structure on the substrate by sputtering, wherein the nucleating layer is an aluminum nitride layer, a diffraction pattern of the nucleating layer includes a plurality of dot patterns, each of the dot patterns is substantially circular, and a ratio between lengths of any two diameters perpendicular to each other on each of the dot patterns ranges from approximately 0.9 to approximately 1.1.

According to an embodiment of the invention, a surface of the substrate close to the nucleating layer is a plane.

A manufacturing method of a semiconductor light emitting device according to the invention includes: providing a substrate; forming a nucleating layer in a form of a single crystal structure on the substrate by sputtering, wherein the nucleating layer is an aluminum nitride layer, a diffraction pattern of the nucleating layer includes a plurality of dot patterns, each of the dot patterns is substantially circular, and a ratio between lengths of any two diameters perpendicular to each other on each of the dot patterns ranges from approximately 0.9 to approximately 1.1; forming a first type semiconductor layer by performing a metal organic chemical vapor deposition process, wherein the first type semiconductor layer is disposed on the nucleating layer; forming an active layer by performing the metal organic chemical vapor deposition process, wherein the active layer is disposed on the first type semiconductor layer; and forming a second type semiconductor layer by performing the metal organic chemical vapor deposition process, wherein the second type semiconductor layer is disposed on the active layer.

According to an embodiment of the invention, a buffer layer is further formed by performing the metal organic chemical vapor deposition process, wherein the buffer layer is disposed between the nucleating layer and the first type semiconductor layer.

According to an embodiment of the invention, a surface of the substrate close to the nucleating layer is a plane.

Based on the above, in the manufacturing method of the epitaxy base and the semiconductor light emitting device of the invention, the nucleating layer is formed on the substrate by sputtering, so as to manufacture the epitaxy base. Since the nucleating layer is the aluminum nitride layer having the single crystal structure and the lattice thereof is well-organized, the semiconductor layers grown subsequently may have a preferable epitaxy quality, and the semiconductor light emitting device with a better working efficiency may thus be manufactured.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
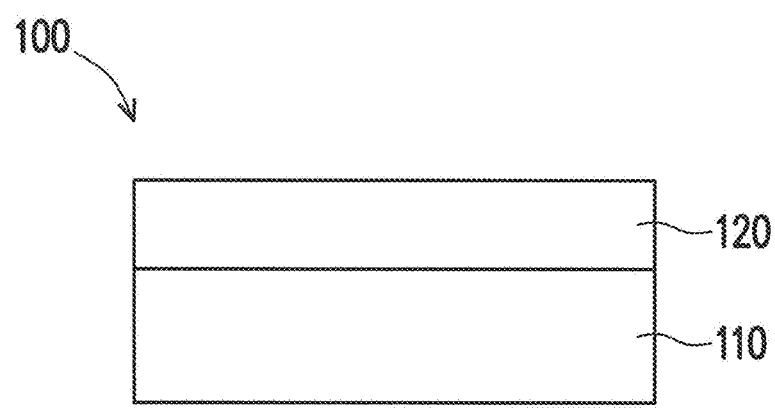
FIG. 1 is a schematic view illustrating an epitaxy base according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic view illustrating an epitaxy base according to an embodiment of the invention. Referring to FIG. 1, an epitaxy base 100 of this embodiment includes a substrate 110 and a nucleating layer 120.

In this embodiment, the substrate 110 is a sapphire substrate. However, in other embodiments, any substrate material capable of growing a Group III-V (e.g. a Group III nitride) semiconductor layer, such as Si, $SiO_2$, GaN, AlN, spinnel, SiC, GaAs, $LiGaO_2$, $LiAlO_2$, or $MgAl_2O_4$, for example, may be used.

As shown in FIG. 1, in this embodiment, the nucleating layer 120 is directly disposed on a surface of the substrate 110, and the surface where the substrate 110 contacts the nucleating layer 120 is a plane. However, in other embodiments, the substrate 110 may have a patterned surface, and a form of the substrate 110 is not limited thereto.

Figure 3:
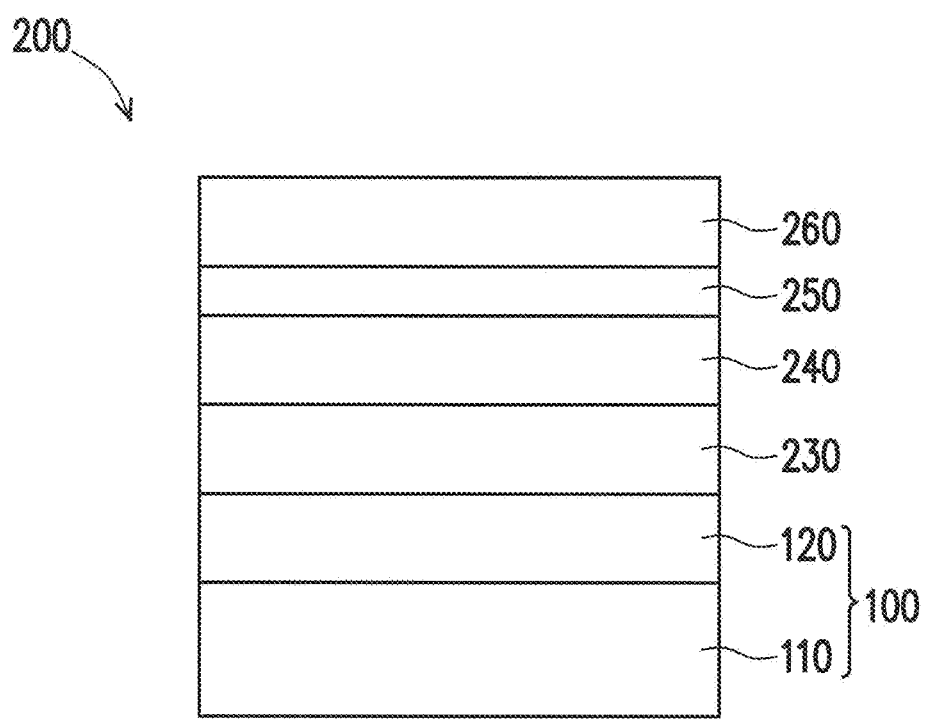
FIG. 3 is a schematic view illustrating a semiconductor light emitting device according to an embodiment of the invention.

The nucleating layer 120 is disposed on the substrate 110, and a purpose of the nucleating layer 120 is to improve a film-forming uniformity of semiconductor layers when the semiconductor layers (e.g. a first type semiconductor layer 240, an active layer 250, and a second type semiconductor layer 260, as shown in FIG. 3) are subsequently grown, so as to improve a working efficiency of a semiconductor structure formed by the semiconductor layers.

In this embodiment, a material of the nucleating layer 120 is aluminum nitride, and the nucleating layer 120 is formed on the substrate 110 by performing a sputtering process. In general, the sputtering process is performed in a space filled with an inert gas (usually argon), and argon is ionized to generate an argon electron flow with a high energy due to an effect of a high potential electrical field. Then, the argon electron flow bombards a target cathode, so as to hit atoms or molecules in the solid target out of the target to be deposited on the substrate 110. Due to a characteristic of sputtering, during the sputtering process, aluminum nitride molecules receive a stronger driving force in a coating direction. Therefore, the nucleating layer 120 is able to be formed in a single crystal structure with a preferable lattice arrangement on the substrate 110. Of course, in other embodiment, the method of forming the nucleating layer 120 is not limited to sputtering, as long as the nucleating layer 120 is formed as a well-organized single crystal structure.

It should be noted that a general description about the appearance of a lattice is referred to as direct lattice, while a space where the direct lattice is located is referred to as real space. When it is intended to observe whether the lattice arrangement of the nucleating layer is a single crystal structure, it is very difficult to make a decision and define according to the real space. Currently, a crystalline structure may be detected by using wave diffraction. And a result thus obtained may indicate whether a lattice arrangement is in a single crystal structure by representing the result in a reciprocal space.

More specifically, a lattice (i.e. reciprocal lattice) represented in the reciprocal space is formed of a normal vector of each crystal plane in the direct lattice, each point in the reciprocal lattice represents a plane, and a connecting line between each point and the origin indicates a normal vector direction of a crystal plane in an original real lattice, a connecting line to a point represents a normal vector direction of a crystal plane in an original real lattice, and a distance thereof represents a reciprocal of a spacing of the crystal plane. An electromagnetic wave (e.g. X-ray) generates diffraction when passing a crystal body, and the diffraction point is a reciprocal lattice point, i.e. a position where the electromagnetic wave generates a fully constructive interference. By using a fluorescent screen or a detector, positions of such points or signals may be detected, the diffraction points are related to the lattice structure, and the relation is a relation between reciprocal lattice and real lattice. Thus, based on the diffraction points or signals, the crystal structure of a material may be known. For example, if the single crystal structure is irradiated by an X-ray with continuous wavelength, any plane meeting the Bragg's Law may generate a strong diffraction. Thus, a crystalline compound may show a specific diffraction pattern. In addition, based on a pattern of distribution of the diffraction points, the symmetry of the lattice may be determined.

In the following, a diffraction pattern of the nucleating layer 120 of the epitaxy base 100 of this embodiment and a diffraction pattern of a conventional nucleating layer are compared. Based on the diffraction patterns thereof, a difference between the nucleating layer of this embodiment and the conventional nucleating layer is clearly shown.

Figure 2A:
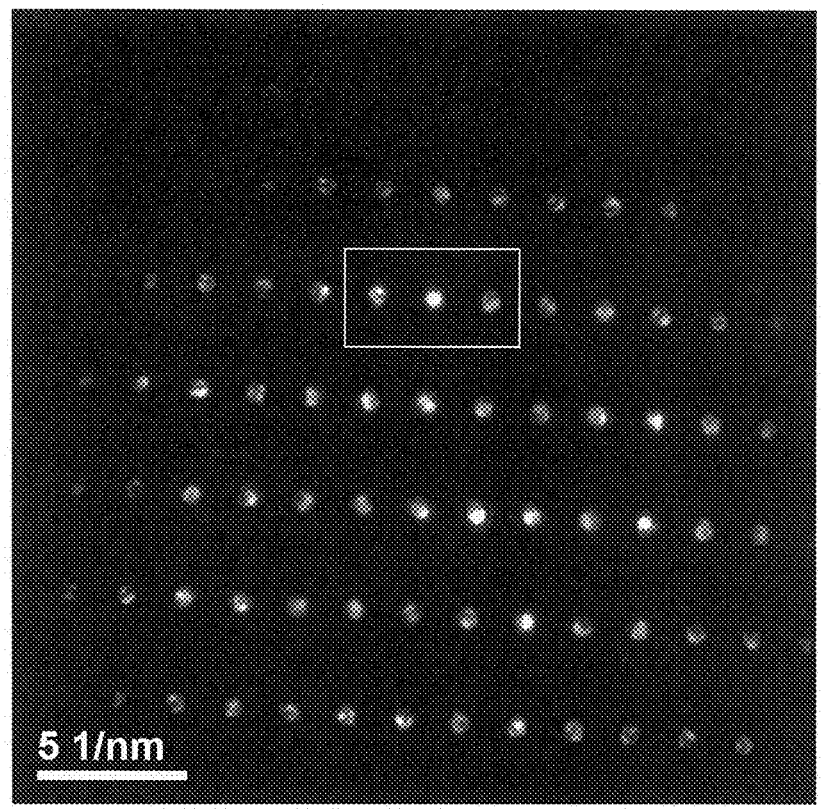
FIG. 2A illustrates an electron diffraction pattern of a nucleating layer of the epitaxy base of FIG. 1.
Figure 2B:
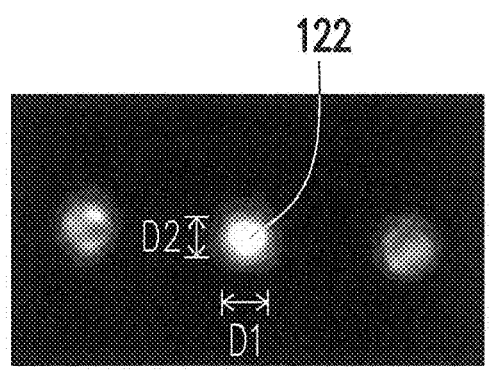
FIG. 2B is an enlarged partial view of FIG. 2A.

FIG. FIG. 2A illustrates the diffraction pattern of the nucleating layer of the epitaxy base of FIG. 1. FIG. 2B is an enlarged schematic partial view of FIG. 2A. Referring to FIGS. 2A and 2B, in this embodiment, the diffraction pattern of the nucleating layer 120 includes a plurality of dot patterns 122. Each of the dot patterns 122 is substantially circular, and a ratio between lengths of any two diameters D1 and D2 perpendicular to each other on each of the dot patterns 122 ranges from approximately 0.9 to approximately 1.1. In a preferred embodiment, the ratio of the lengths of the arbitrary diameters D1 and D2 perpendicular to each other on each of the dot patterns 122 is substantially 1. Judging from shapes of the circular dot patterns 122 shown in FIGS. 2A and 2B, it can be known that the nucleating layer 120 of the epitaxy base 100 of this embodiment is a well-organized single crystal structure.

Figure 2C:
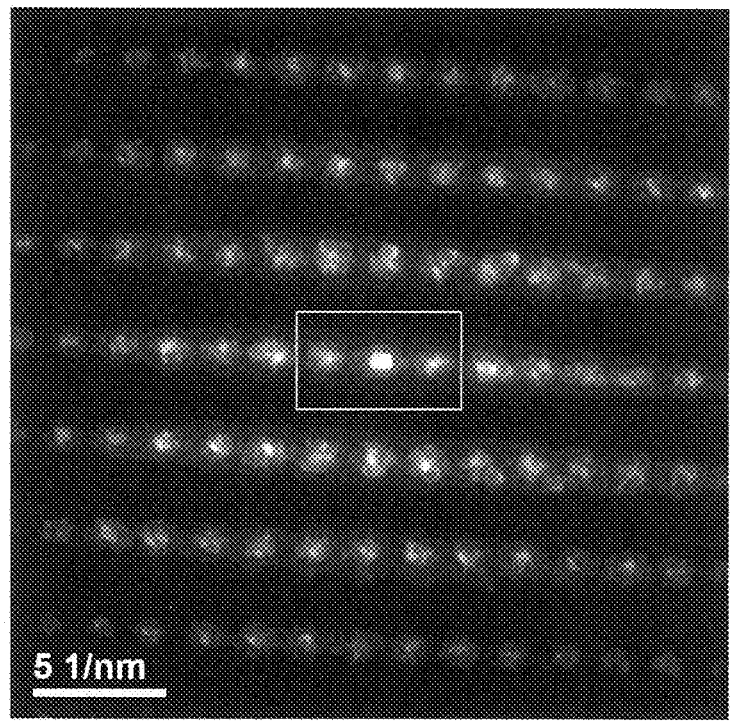
FIG. 2C illustrates a diffraction pattern of a conventional nucleating layer.
Figure 2D:
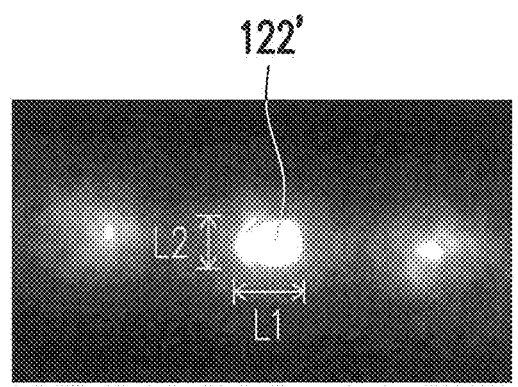
FIG. 2D is an enlarged partial view of FIG. 2C.

FIG. 2C illustrates the diffraction pattern of the conventional nucleating layer. FIG. 2D is an enlarged schematic partial view of FIG. 2C. Referring to FIGS. 2C and 2D, the diffusion pattern of the conventional nucleating pattern also includes a plurality of dot patterns 122'. However, a profile of each of the dot patterns 122' is distorted and in a non-circular shape. In FIG. 2D, a ratio between lengths of any two line segments L1 and L2 perpendicular to each other and passing a center of each of the dot patterns 122' is greater than 1.1. As shown in FIG. 2C, it can be known that there is a continuous change in a lattice arrangement of the conventional nucleating layer along a C direction (close to a horizontal direction in the figure). Thus, it is determined that the nucleating layer is not a well-organized single crystal structure.

Since the epitaxy base 100 of this embodiment has the nucleating layer 120 having a single crystal structure with a generally well-arranged lattice, when the semiconductor layers are subsequently formed on the nucleating layer 120, the epitaxy quality may be more preferable. In the following, a semiconductor light emitting device 200 having the epitaxy base 100 is described.

FIG. 3 is a schematic view illustrating a semiconductor light emitting device according to an embodiment of the invention. Referring to FIG. 3, the semiconductor light emitting device 200 of this embodiment includes the epitaxy base 100 of FIG. 1, a buffer layer 230, a first type semiconductor layer 240, an active layer 250, and a second type semiconductor layer 260. The buffer layer 230 is disposed on the nucleating layer 120. The first type semiconductor layer 240 is disposed on the buffer layer 230. The active layer 250 is disposed on the first type semiconductor layer 240. The second type semiconductor layer 260 is disposed on the active layer 250. It should be noted that thicknesses of the layers shown in FIG. 3 are only for an illustrative purpose, and the thicknesses of the layers in the actual practice are not limited thereto.

In this embodiment, the buffer layer 230 includes a Group III-V compound semiconductor which is undoped gallium nitride, for example. Given that the semiconductor layers are subsequently grown on the epitaxy base 100, there may be lattice mismatch as well as mismatch in thermal expansion coefficient since there are significant differences in lattice constant and thermal expansion coefficient between the semiconductor layers and the substrate 110. In this embodiment, the buffer layer 230 is disposed on the nucleating layer 120 to reduce the lattice mismatch between the semiconductor layers and the substrate 110, so as to offer a more preferable epitaxy quality to the subsequent semiconductor layers, such that the semiconductor light emitting device 200 has a preferable working efficiency. Of course, in other embodiments, the buffer layer 230 may be omitted from the semiconductor light emitting device 200. In this way, the first type semiconductor layer 240 is directly disposed on the nucleating layer 120.

The first type semiconductor layer 240 is, for example, an n-type nitride semiconductor layer, the second type semiconductor layer 260 is, for example, a p-type nitride semiconductor layer, and the active layer 250 is, for example, a multi-quantum well structure. The first type semiconductor layer 240 and the second type semiconductor layer 260 are, for example, GaN, AlGaN, or InGaN. An n-type dopant doped in the first type semiconductor layer 240 may include at least one Group IVA element, and a p-type dopant doped in the second type semiconductor layer 260 may include at least one Group IIA element. In this embodiment, the n-type dopant may be silicon, and the p-type dopant may be magnesium. However, the types of the n-type and p-type dopants are not limited thereto.

In the semiconductor light emitting device 200 of this embodiment, since the nucleating layer 120 of the epitaxy base 100 has the single crystal structure with the well-organized lattice, the epitaxy quality of the buffer layer 230, the first type semiconductor layer 240, the active layer 250, and the second type semiconductor layer 260 that are subsequently disposed on the nucleating layer 120 is improved. Thus, the semiconductor light emitting device 200 has a preferable working efficiency.

Figure 4:
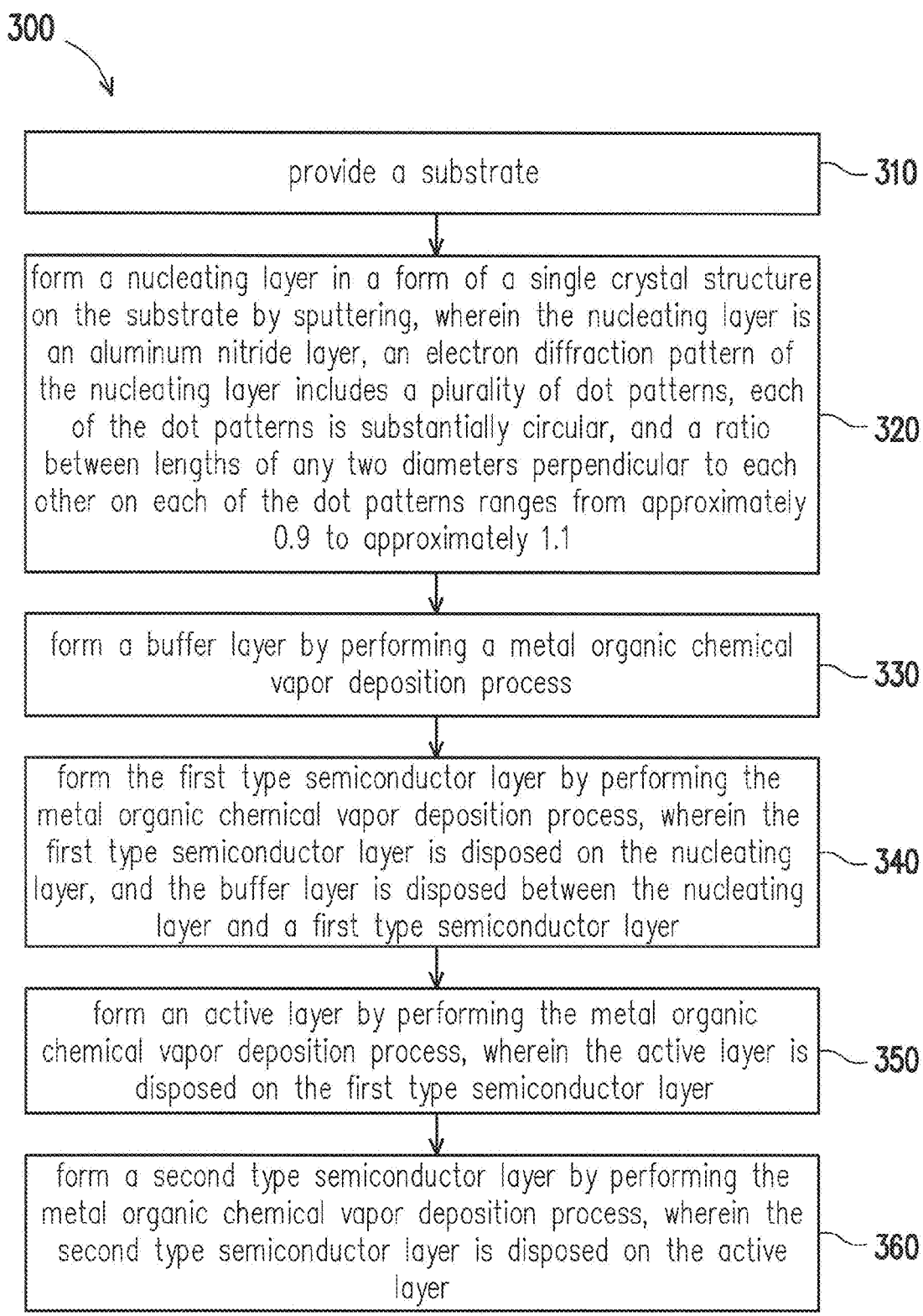
FIG. 4 is a schematic flowchart illustrating a manufacturing method of a semiconductor light emitting device according to an embodiment of the invention.

FIG. 4 is a schematic flowchart illustrating a manufacturing method of a semiconductor light emitting device according to an embodiment of the invention. Referring to FIG. 4, in this embodiment, a manufacturing method 300 of a semiconductor light emitting device includes a method of manufacturing an epitaxy base. The method of manufacturing the epitaxy base includes steps as follows. First of all, a substrate is provided (Step 310). In this embodiment, the epitaxy substrate is a sapphire substrate. However, in other embodiments, any substrate material capable of growing a Group III-V (e.g. a Group III nitride) semiconductor layer may be used.

Then, a nucleating layer is formed on the substrate in a form of a single crystal structure by performing a sputtering process. In addition, the nucleating layer is a aluminum nitride layer, a diffraction pattern of the nucleating layer includes a plurality of dot patterns, each of the dot patterns is substantially circular, and a ratio between lengths of any two diameters perpendicular to each other on each of the dot patterns ranges from approximately 0.9 to approximately 1.1 (Step 320). By performing the steps above, the epitaxy base having a preferable epitaxy quality is manufactured.

After the epitaxy base is manufactured, the following steps are performed. A buffer layer is formed by performing a metal organic chemical vapor deposition process (Step 330). In this embodiment, the buffer layer includes a Group III-V compound semiconductor which is undoped gallium nitride, for example. In addition, in other embodiments, Step 330 may be skipped, and Step 340 may be directly performed.

Then, the first-type semiconductor layer is formed by performing the metal organic chemical vapor deposition process, and the first type semiconductor layer is disposed on the nucleating layer, and the buffer layer is disposed between the nucleating layer and the first type semiconductor layer (Step 340). In this embodiment, the first type semiconductor layer is, for example, GaN, AlGaN, or InGaN.

Then, an active layer is formed by performing the metal organic chemical vapor deposition process, and the active layer is disposed on the first type semiconductor layer (Step 350). The active layer is a multi-quantum well structure, for example.

Lastly, a second type semiconductor layer is formed by performing the metal organic chemical vapor deposition process, and the second type semiconductor layer is disposed on the active layer (Step 360). In this embodiment, the second type semiconductor layer is, for example, GaN, AlGaN, or InGaN.

In the manufacturing method 300 of the semiconductor light emitting device of this embodiment, the nucleating layer is formed on the substrate by sputtering, such that the nucleating layer is formed as the single crystal structure having the well-organized lattice. Then, the buffer layer, the first type semiconductor layer, the active layer, and the second semiconductor layer subsequently formed on the nucleating layer may have a preferable epitaxy quality, thus making the semiconductor light emitting device have a preferable working efficiency.

In view of the foregoing, in the manufacturing method of the epitaxy base and the semiconductor light emitting device of the invention, the nucleating layer is formed on the substrate by sputtering, so as to manufacture the epitaxy base. Since the nucleating layer is the aluminum nitride layer having the single crystal structure and the lattice thereof is well-organized, the semiconductor layers grown subsequently may have a preferable epitaxy quality, and the semiconductor light emitting device with a better working efficiency may thus be manufactured.

Although the present invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed is:

1. A semiconductor light emitting device, comprising:
    an epitaxy base, comprising
        a substrate; and
        a nucleating layer, disposed on the substrate, wherein the nucleating layer is an aluminum nitride layer having a single crystal structure, an electron diffraction pattern of the nucleating layer comprises a plurality of dot patterns, each of the dot patterns is substantially circular, and a ratio between lengths of any two diameters perpendicular to each other on each of the dot patterns ranges from approximately 0.9 to approximately 1.1;
    a first type semiconductor layer, disposed on the nucleating layer;
    a buffer layer, disposed between the nucleating layer and the first type semiconductor layer;
    an active layer, disposed on the first type semiconductor layer, and
    a second type semiconductor layer, disposed on the active layer.

2. The semiconductor light emitting device as claimed in claim 1, wherein a surface of the substrate close to the nucleating layer is a plane.

3. The semiconductor light emitting device as claimed in claim 1, wherein the nucleating layer is formed on the substrate by sputtering.

4. A method of manufacturing a semiconductor light emitting device, comprising:
    providing a substrate;
    forming a nucleating layer in a form of a single crystal structure on the substrate by sputtering, wherein the nucleating layer is an aluminum nitride layer, an electron diffraction pattern of the nucleating layer comprises a plurality of dot patterns, each of the dot patterns is substantially circular, and a ratio between lengths of any two diameters perpendicular to each other on each of the dot patterns ranges from approximately 0.9 to approximately 1.1;
    forming a first type semiconductor layer by performing a metal organic chemical vapor deposition process, wherein the first type semiconductor layer is disposed on the nucleating layer;
    forming a buffer layer by performing the metal organic chemical vapor deposition process, wherein the buffer layer is disposed between the nucleating layer and the first type semiconductor layer;
    forming an active layer by performing the metal organic chemical vapor deposition process, wherein the active layer is disposed on the first type semiconductor layer; and
    forming a second type semiconductor layer by performing the metal organic chemical vapor deposition process, wherein the second type semiconductor layer is disposed on the active layer.

* * * * *